(12) United States Patent
Hirano et al.

(10) Patent No.: US 12,142,450 B2
(45) Date of Patent: Nov. 12, 2024

(54) PHOTOELECTRIC-SURFACE ELECTRON SOURCE

(71) Applicant: HAMAMATSU PHOTONICS K.K., Hamamatsu (JP)

(72) Inventors: Tomohiko Hirano, Hamamatsu (JP); Hiroyuki Taketomi, Hamamatsu (JP); Motohiro Suyama, Hamamatsu (JP); Wataru Matsudaira, Hamamatsu (JP); Akihiro Kageyama, Hamamatsu (JP); Kota Iwasaki, Yokohama (JP); Taku Yamada, Yokohama (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 18/021,457

(22) PCT Filed: Jun. 9, 2021

(86) PCT No.: PCT/JP2021/021957
§ 371 (c)(1),
(2) Date: Feb. 15, 2023

(87) PCT Pub. No.: WO2022/038867
PCT Pub. Date: Feb. 24, 2022

(65) Prior Publication Data
US 2023/0343541 A1    Oct. 26, 2023

(30) Foreign Application Priority Data

Aug. 21, 2020    (JP) ................................. 2020-140141

(51) Int. Cl.
*H01J 1/34*    (2006.01)
*H01J 1/88*    (2006.01)

(52) U.S. Cl.
CPC .   *H01J 1/34* (2013.01); *H01J 1/88* (2013.01)

(58) Field of Classification Search
CPC ...................................... H01J 1/34; H01J 1/88
(Continued)

(56) References Cited

U.S. PATENT DOCUMENTS 6,297,489 B1 * 10/2001 Suyama .................. H01J 43/28
313/532

FOREIGN PATENT DOCUMENTS

JP    H4-322049 A    11/1992
JP    H9-213205 A    8/1997
(Continued)

OTHER PUBLICATIONS

International Preliminary Report on Patentability mailed Mar. 2, 2023 for PCT/JP2021/021957.

*Primary Examiner* — Karabi Guharay
(74) *Attorney, Agent, or Firm* — Faegre Drinker Biddle & Reath LLP

(57) ABSTRACT

A photoelectric-surface electron source includes: a glass substrate that receives laser light from a substrate light-receiving surface including microlenses and that focuses the laser light toward a substrate main surface located on the opposite side from the substrate light-receiving surface; a photoelectric surface that is provided to the substrate main surface, and that receives the focused laser light and emits photoelectrons; and an extraction electrode that is fixed to the substrate main surface and that extracts the photoelectrons from the photoelectric surface. The extraction electrode is disposed away from the photoelectric surface along the normal direction of the substrate main surface and has: an electrode part in which electrode holes for allowing the photoelectrons to pass therethrough are provided; and a frame part that is fixed to a region surrounding the photoelectric surface in the substrate main surface.

18 Claims, 7 Drawing Sheets

(58) Field of Classification Search
USPC .......................................................... 313/542
See application file for complete search history.

(56)  References Cited

FOREIGN PATENT DOCUMENTS

| | | |
|---|---|---|
| JP | 2005-533365 A | 11/2005 |
| JP | 2005-339844 A | 12/2005 |
| WO | WO-03/040829 A2 | 5/2003 |

* cited by examiner

PHOTOELECTRIC-SURFACE ELECTRON SOURCE

TECHNICAL FIELD

The present invention relates to a photoelectric-surface electron source.

BACKGROUND ART

Conventionally, electron sources are used. Electron sources emit photoelectrons in response to incident light from the outside. For example, Patent Literature 1 discloses a photoelectric-surface electron source. The photoelectric-surface electron source emits photoelectrons in response to incidence of laser light.

CITATION LIST

Patent Literature

[Patent Literature 1] Japanese Unexamined Patent Publication No. 2005-533365

SUMMARY OF INVENTION

Technical Problem

The photoelectric-surface electron source of Patent Literature 1 has a structure in which an extraction electrode is disposed on a front surface of a photoelectric surface. In this structure, arrangement of the extraction electrode on the photoelectric surface is important. In a case in which the extraction electrode is not stably disposed on the photoelectric surface, photoelectrons cannot be stably extracted. Accordingly, desired electron beam characteristics cannot be obtained.

An object of the present invention is to provide a photoelectric-surface electron source in which desired electron beam characteristics can be obtained.

Solution to Problem

A photoelectric-surface electron source according to one aspect of the present invention includes: a substrate configured to receive light incident from a substrate light-receiving surface and emit the light from a substrate main surface on a side opposite to the substrate light-receiving surface; a photoelectric surface provided on the substrate main surface to receive the light to emit photoelectrons; and an extraction electrode fixed to the substrate main surface to extract the photoelectrons from the photoelectric surface, wherein the extraction electrode includes: an electrode part that is disposed to be separated from the photoelectric surface on the substrate main surface side and provided with holes through which the photoelectrons pass; and a frame part fixed to a region surrounding the photoelectric surface on the substrate main surface.

In the extraction electrode, the electrode part provided with the holes that causes the electrons to pass therethrough is fixed to the substrate by the frame part. As a result, it is possible to stably fix the electrode part to the substrate. Accordingly, it is possible to obtain electron beams having desired characteristics.

In the photoelectric-surface electron source according to one aspect, a lens part configured to focus the light toward the photoelectric surface may be disposed on the substrate light-receiving surface side. According to this configuration, it is possible to obtain electron beams based on the focused light.

In the photoelectric-surface electron source, the electrode part and the frame part may be an integral member. According to this configuration, it is possible to fix the electrode part to the substrate in a more stable state.

In one aspect, a surrounding electrode configured to surround the extraction electrode may be further provided to expose the electrode part of the extraction electrode. According to this configuration, an electric field around the extraction electrode can be controlled. Accordingly, it is possible to control an electron trajectory of the emitted photoelectrons.

In one aspect, a main surface of the surrounding electrode may be flush with an electrode main surface that is a surface of the electrode part on a side from which the electrons are emitted. According to this configuration, the electric field around the extraction electrode can be stabilized. Accordingly, it is possible to stabilize the electron trajectory of the emitted photoelectrons.

In one aspect, the surrounding electrode may have the same potential as the extraction electrode. According to this configuration, the electric field around the extraction electrode can be stabilized. Accordingly, it is possible to stabilize the electron trajectory of the emitted photoelectrons.

In one aspect, the surrounding electrode may be made of a metal material. According to this configuration, it is possible to easily manufacture the surrounding electrode with higher precision.

In one aspect, the extraction electrode may include an electrode body made of a semiconductor material and a conductive film covering a surface of the electrode body. According to this configuration, it is possible to easily manufacture the extraction electrode that includes a through hole and can be set to a predetermined potential.

In one aspect, the substrate may further include an electrode bonding part provided on the substrate main surface to mechanically and electrically connect the frame part of the extraction electrode, and a voltage applying part configured to apply a voltage to the extraction electrode via the electrode bonding part. According to this configuration, it is possible to reliably perform fixation of the extraction electrode to the substrate and power supply to the extraction electrode.

In one aspect, the frame part may include a frame bonding part fixed to the substrate main surface. An inner wall surface of the frame part may be inclined to widen from the electrode part side toward the frame bonding part. According to this configuration, the frame bonding part can be kept away from the photoelectric surface. Accordingly, it is possible to improve withstand voltage performance between the frame bonding part and the photoelectric surface.

Advantageous Effects of Invention

According to the photoelectric-surface electron source of the present invention, desired electron beam characteristics can be obtained.

DESCRIPTION OF EMBODIMENTS

Figure 1:
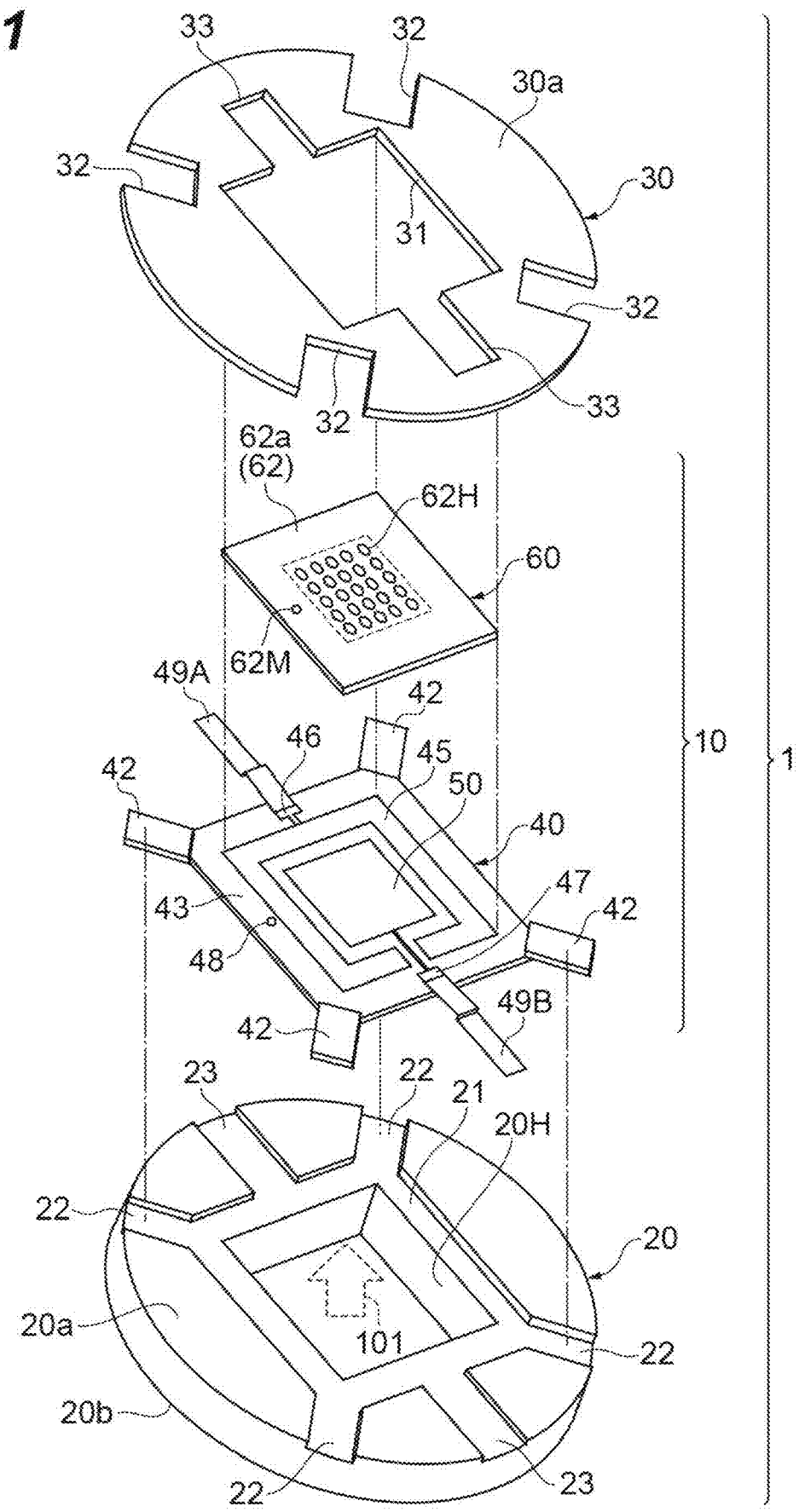
FIG. 1 is an exploded perspective view of a photoelectric-surface electron source according to an embodiment.

Embodiments for implementing the present invention will be described in detail below with reference to the accompanying drawings. In the following description, the same elements will be denoted by the same reference numerals, and repeated description thereof will be omitted. The drawings are schematic for clarity of the content of the present invention. Sizes and the number of each part shown in the drawings do not necessarily correspond to actual configurations.

A photoelectric-surface electron source 1 shown in FIG. 1 is a multi-beam photoelectric-surface electron source that can generate a plurality of electron beams. The photoelectric-surface electron source 1, which is a high-precision multi-beam electron source, has high electron utilization efficiency and uniform electron beam characteristics. The photoelectric-surface electron source 1 generates a plurality of electron beams as a result of receiving laser light 101 whose wavelength is in the ultraviolet region, for example. The photoelectric-surface electron source 1 has, as main constituent elements, a photoelectric-surface electron source unit 10, a base 20, and a surrounding electrode 30.

The photoelectric-surface electron source unit 10 has a glass substrate 40, a photoelectric surface 50, and an extraction electrode 60. The glass substrate 40 has a lens array provided with a plurality of microlenses 41 (see FIG. 2, a lens part). The glass substrate 40 is a rectangular plate member when viewed in a direction facing a substrate main surface 43, which will be described later. A material of the glass substrate 40 has the property of transmitting the laser light 101 with which the photoelectric surface 50 is irradiated. For example, the material of the glass substrate 40 is quartz glass, calcium fluoride, magnesium fluoride, or sapphire.

The glass substrate 40 is disposed on the base 20. The glass substrate 40 is fixed to the base 20 by fixing members 42. The glass substrate 40 has the substrate main surface 43 and a substrate back surface 44 (see FIG. 2). The glass substrate 40 has the plurality of microlenses 41, an electrode bonding part 45, an extraction power supply part 46 (a voltage applying part), and a photoelectric-surface power supply part 47. The plurality of microlenses 41 are provided in a lens array region L (see FIG. 2). The lens array region L is provided on the substrate back surface 44.

The electrode bonding part 45, the extraction power supply part 46, and the photoelectric-surface power supply part 47 are provided on the substrate main surface 43. An aligning mark 48 is provided on the substrate main surface 43 or the substrate back surface 44. The mark 48 is used for positioning work when the extraction electrode 60 is bonded to the glass substrate 40. The mark 48 is provided near an outside of the electrode bonding part 45.

Figure 2:
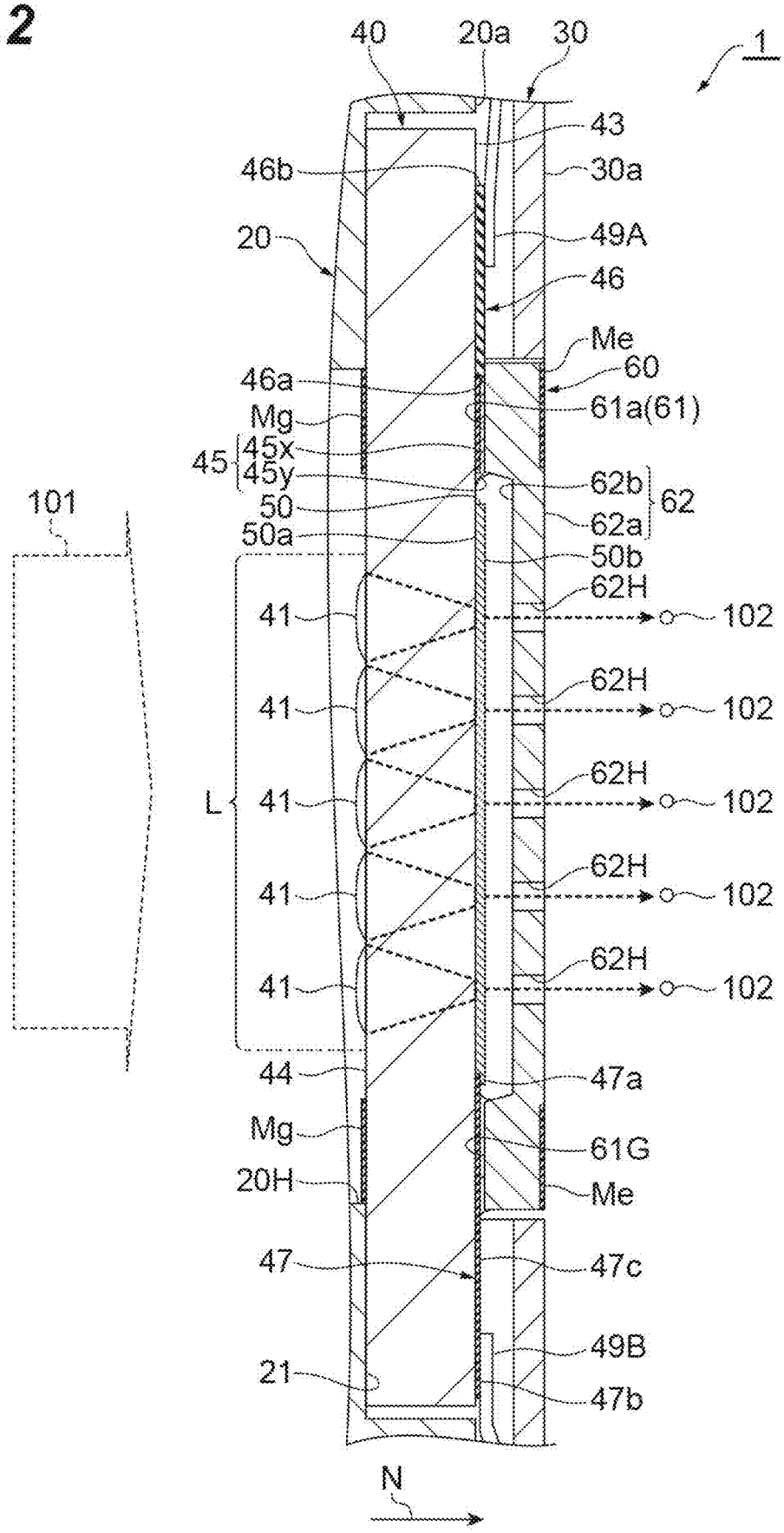
FIG. 2 is an enlarged cross-sectional view showing a main part of the photoelectric-surface electron source.
Figure 3:
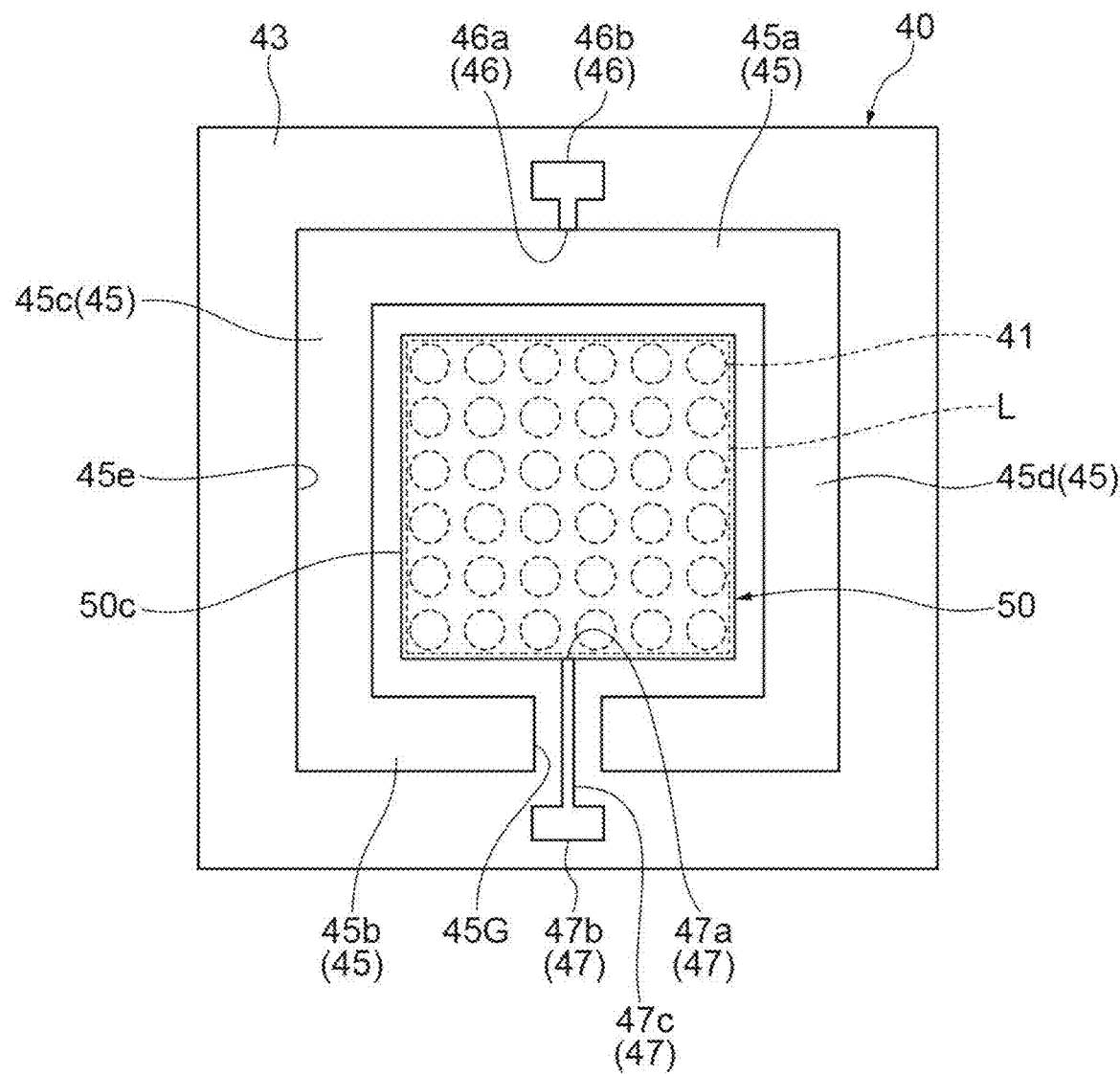
FIG. 3 is a plan view showing a main surface of a glass substrate.

The electrode bonding part 45 fixes the extraction electrode 60 to the glass substrate 40. As shown in FIG. 2, the electrode bonding part 45 includes a metal film layer 45x and a bonding member 45y. The metal film layer 45x is a pattern of a metal film. The pattern of the metal film is provided on the substrate main surface 43 of the glass substrate 40. The bonding member 45y is provided between the metal film layer 45x and the extraction electrode 60. The metal film layer 45x is a metal film in which chromium (Cr), platinum (Pt), and gold (Au) are laminated in order from the substrate main surface 43 of the glass substrate 40. A metal film layer Mg is provided on the substrate back surface 44 of the glass substrate 40 to face the metal film layer 45x. The metal film layer Mg is a pattern of a metal film. The metal film layer Mg inhibits warping of the glass substrate 40 that may occur due to formation of the metal film layer 45x. The metal film layer Mg maintains a distance H (which will be described later, see FIG. 5) from the photoelectric surface 50 to an electrode part 62 at a predetermined distance. As a result, it is possible to precisely control an electron trajectory. The electrode bonding part 45 applies a voltage given from the extraction power supply part 46 to the extraction electrode 60. It can also be said that the electrode bonding part 45 is a power supply pattern. The electrode bonding part 45 is provided on the substrate main surface 43 of the glass substrate 40, which is an insulator. As shown in FIG. 3, the electrode bonding part 45 surrounds the lens array region L when viewed in the direction facing the substrate main surface 43 of the glass substrate 40. The plurality of microlenses 41 are provided in the lens array region L. The electrode bonding part 45 includes parts 45a, 45b, 45c, and 45d. The parts 45a, 45b, 45c, and 45d constitute respective side parts of the electrode bonding part 45 forming a frame shape when viewed in the direction facing the substrate main surface 43 of the glass substrate 40. The part 45b includes an opening part 45G. The substrate main surface 43 is exposed from the opening part 45G. A part of the photoelectric-surface power supply part 47 is disposed in the opening part 45G.

The extraction power supply part 46 applies a predetermined voltage to the extraction electrode 60. The extraction power supply part 46 is provided outside the electrode bonding part 45. The extraction power supply part 46 has an end part 46a and an end part 46b. The end part 46a is connected to the electrode bonding part 45. The end part 46b is an electrode pad. The end part 46a is connected to the part 45a of the electrode bonding part 45. The part 45a faces the part 45b provided with the opening part 45G. A conductive fastener 49A (see FIG. 1) is electrically connected to the end part 46b.

The photoelectric-surface power supply part 47 applies a predetermined voltage to the photoelectric surface 50. The photoelectric-surface power supply part 47 has an end part 47a, an end part 47b, and a wiring part 47c. The end part 47a is provided in a region in which the photoelectric surface 50 is disposed. The end part 47b is provided outside the electrode bonding part 45. The wiring part 47c connects the end part 47a to the end part 47b. The photoelectric-surface power supply part 47 extends from the region in which the photoelectric surface 50 is disposed to the outside of the electrode bonding part 45. A part thereof from the one end part 47a to the other end part 47b is separated from the electrode bonding part 45. The part between the one end part 47a and the other end part 47b passes through the opening part 45G of the electrode bonding part 45. The photoelectric surface 50 is electrically connected to the end part 47a. The end part 47b is an electrode pad. A conductive fastener 49B (see FIG. 1) is electrically connected to the end part 47b.

A material of the photoelectric surface 50 shown in FIG. 2 is platinum (Pt). The photoelectric surface 50 is rectangular in a plan view in a direction facing the substrate main surface 43 of the glass substrate 40. The photoelectric surface 50 has a substrate light-receiving surface 50a and an electron emitting surface 50b. The photoelectric surface 50 is provided substantially at a center of the substrate main surface 43. As shown in FIG. 3, the photoelectric surface 50 overlaps the lens array region L in a plan view seen in the direction facing the substrate main surface 43 of the glass substrate 40. The plurality of microlenses 41 are provided in the lens array region L. The photoelectric surface 50 is provided in a region surrounded by the electrode bonding part 45. The photoelectric surface 50 is separated from the electrode bonding part 45. The photoelectric surface 50 is electrically insulated from the electrode bonding part 45. The substrate main surface 43 is exposed from the region between the photoelectric surface 50 and the electrode bonding part 45.

The extraction electrode 60 has a substantially rectangular plate shape when viewed in the direction facing the substrate main surface 43 of the glass substrate 40. The extraction electrode 60 is fixed to the substrate main surface 43. Specifically, the extraction electrode 60 is fixed by being bonded to the electrode bonding part 45 of the substrate main surface 43. An external shape of the extraction electrode 60 is substantially the same as an external shape of the electrode bonding part 45. The extraction electrode 60 has a frame part 61 and the electrode part 62. The frame part 61 and the electrode part 62 are integral members.

Figure 4:
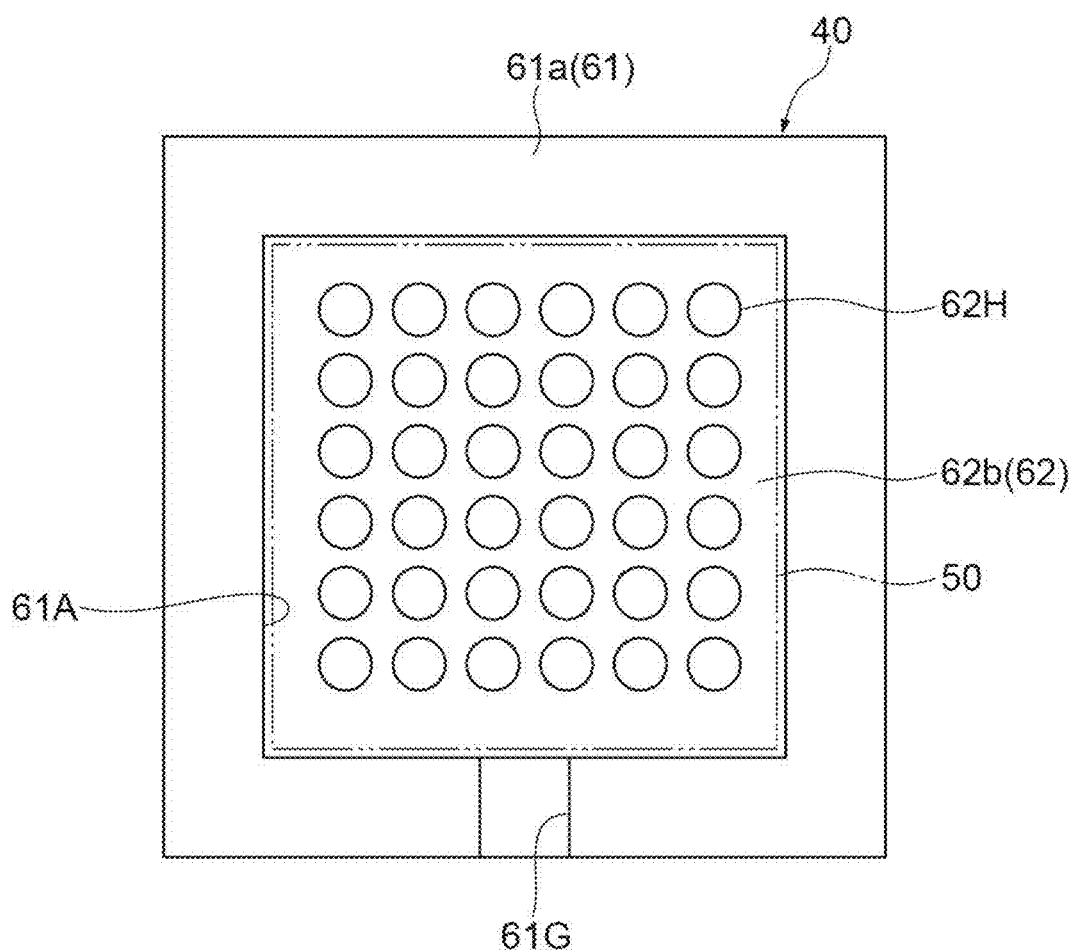
FIG. 4 is a plan view showing a back surface of an extraction electrode.
Figure 5:
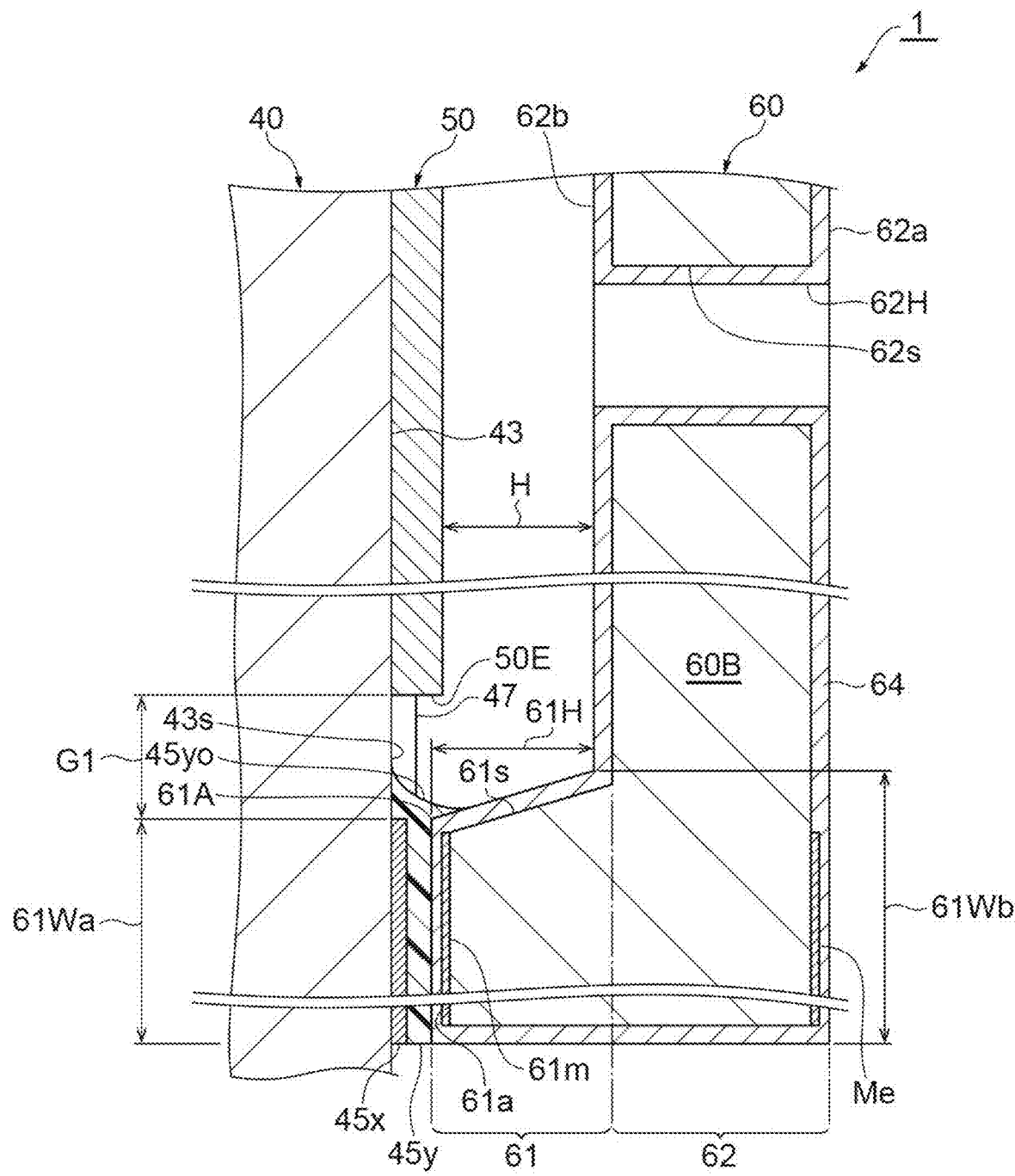
FIG. 5 is an enlarged cross-sectional view showing a part of FIG. 2.

As shown in FIG. 4, the frame part 61 has a frame shape when viewed in the direction facing the substrate main surface 43 of the glass substrate 40. The frame part 61 surrounds at least the photoelectric surface 50. The frame part 61 has a frame bonding part 61a. The frame bonding part 61a is bonded to the electrode bonding part 45. As shown in FIG. 5, a metal film layer 61m, which is a metal film pattern, is formed on the frame bonding part 61a. The metal film layer 61m is a metal film in which titanium (Ti), platinum (Pt), and gold (Au) are laminated in order on the frame bonding part 61a. A metal film layer Me is provided in a part of an electrode main surface 62a of the electrode part 62 that faces the metal film layer 61m. The metal film layer Me inhibits warping of the extraction electrode 60 that may occur due to formation of the metal film layer 61m. The metal film layer Me maintains a distance H (described later) from the photoelectric surface 50 to the electrode part 62 at a predetermined distance. As a result, it is possible to precisely control the electron trajectory. A planar shape of the frame bonding part 61a is substantially the same as a planar shape of the electrode bonding part 45. The frame part 61 has an opening part 61G (see FIG. 4). The electrode part 62 is provided on a side opposite to the frame bonding part 61a in the frame part 61. The frame part 61 extends in a normal direction N of the substrate main surface 43. The frame part 61 has a predetermined height 61H (see FIG. 5). The frame part 61 is the most important factor that defines the distance H in the normal direction N from the photoelectric surface 50 to the electrode part 62. In other words, the height 61H of the frame part 61 is the most important factor that defines the distance H from the photoelectric surface 50 to the electrode part 62.

The electrode part 62 covers a region surrounded by the frame part 61. A predetermined voltage is applied to the electrode part 62. An electric field is generated between the electrode part 62 and the photoelectric surface 50 by the applied voltage. As a result, photoelectrons 102 generated on the photoelectric surface 50 are extracted. As shown in FIG. 2, the electrode part 62 has an electrode back surface 62b, the electrode main surface 62a, and electrode holes 62H. The electrode back surface 62b faces the substrate main surface 43. The electrode back surface 62b faces the photoelectric surface 50. The electrode main surface 62a is a surface opposite to the electrode back surface 62b. The electrode main surface 62a is a surface from which the photoelectrons 102 are emitted.

The electrode part 62 is provided with a plurality of electrode holes 62H. The electrode holes 62H are through holes. The electrode holes 62H penetrate from the electrode back surface 62b to the electrode main surface 62a. Arrangement of the electrode holes 62H includes of a plurality of rows and columns, for example. The arrangement of the electrode holes 62H is regular. A region in which the electrode holes 62H are provided overlaps a region in which the lens array region L and the photoelectric surface 50 are formed. More specifically, the region in which the electrode holes 62H are provided overlaps a partial region of the photoelectric surface 50. The partial region of the photoelectric surface 50 is irradiated with the laser light 101 condensed by the lens array region L.

One electrode hole 62H corresponds to one microlens 41 in the lens array region L of the glass substrate 40. It is more preferable that a central axis of a predetermined electrode hole 62H coincide with an optical axis of a predetermined opposing microlens 41. In other words, it is more preferable that the central axis of the predetermined electrode hole 62H coincide with an optical axis of a spot condensed by the predetermined opposing microlens 41.

An alignment mark 62M (see FIG. 1) is provided on the electrode main surface 62a. The alignment mark 62M is used for bonding to the glass substrate 40. The alignment mark 62M is provided outside the region in which the electrode holes 62H are formed.

As shown in FIG. 5, the frame part 61 and the electrode part 62 of the extraction electrode 60 have a base part 60B (an electrode body) made of silicon, which is a semiconductor material, and a metal film 64 (a conductive film) covering the base part 60B. That is, surfaces of the frame part 61 and the electrode part 62 are covered with the metal film 64. The metal film 64 includes platinum (Pt), chromium (Cr), and ruthenium (Ru), for example. Accordingly, the surfaces of the frame part 61 and the electrode part 62 are coated with the metal film and thus have conductivity. The surfaces of the frame part 61 include a side surface of the frame part 61 in addition to the frame bonding part 61a. The surfaces of the electrode part 62 include inner wall surfaces 62s of the electrode holes 62H in addition to the electrode back surface 62b and the electrode main surface 62a. Accordingly, the extraction electrode 60 can be supplied with a voltage from the electrode bonding part 45 via the metal film 64 of the frame bonding part 61a.

The plurality of electrode holes 62H of the extraction electrode 60 can be easily formed by etching a silicon substrate. For example, the inner wall surfaces 62s of the electrode holes 62H are substantially perpendicular to the electrode main surface 62a. The electrode holes 62H can be formed by so-called deep reactive-ion etching (DRIE). A silicon on insulator (SOI) substrate having a three-layer structure may be used for the silicon substrate. An SOI substrate having a three-layer structure includes an insulator layer, such as silicon dioxide, inside silicon. According to the SOI substrate having the three-layer structure, etching stops at the insulating layer during etching. Accordingly, it is easy to control an etching depth. In the case of the SOI substrate, the insulator layer may prevent the entire substrate from being at the same potential. Accordingly, it is important to reliably cover surfaces of the SOI substrate with the metal film 64. Unlike the inner wall surfaces 62s, an inner wall surface 61s of the frame part 61 is not substantially perpendicular to the electrode main surface 62a or the electrode back surface 62b. The inner wall surface 61s is inclined relative to the electrode main surface 62a or the electrode back surface 62b. For example, the inner wall surface 61s is inclined relative to the normal direction N. An angle at which the inner wall surface 61s is inclined relative to the normal direction N is 35±10 degrees. Specifically, the inner wall surface 61s is inclined to widen from the electrode part 62 side toward the frame bonding part 61a. A cross-sectional area of a space surrounded by the inner wall surface 61s of the frame part 61 in a direction perpendicular to the normal direction N increases from the electrode part 62 side toward the frame bonding part 61a. The inner wall surface 61s is inclined such that a width of the frame part 61 narrows from the inner wall surface 61s side in a direction from the electrode part 62 toward the frame part 61. The inner wall surface 61s is inclined such that the width of the frame part 61 narrows from the inner wall surface 61s in a direction opposite to the normal direction N. A width 61Wa of the frame bonding part 61a is narrower than a width 61Wb of a boundary between the frame part 61 and the electrode part 62. An area of an opening 61A surrounded by the frame bonding part 61a on the back surface side of the extraction electrode 60 is larger than an area of the electrode back surface 62b.

A distance G1 from the photoelectric surface 50 to the extraction electrode 60 can be widened on the substrate main surface 43. The distance G1 from an edge part 50E of the photoelectric surface 50 to the frame bonding part 61a of the extraction electrode 60 can be widened. As a result, withstand voltage performance between the photoelectric surface 50 and the extraction electrode 60 to which different voltages are applied is improved.

According to this configuration, the area of the photoelectric surface 50 can be enlarged. As a result, influence of disturbance of the electric field around the photoelectric surface 50 on the trajectory of the photoelectrons 102 can be reduced. The extraction electrode 60 is bonded to the glass substrate 40 with the bonding member 45y such as indium. In a case in which a sufficient gap G1 is secured between the photoelectric surface 50 and the extraction electrode 60, it is possible to inhibit influence on the withstand voltage performance even when a bonding member 45yo protrudes into an exposed region 43s of the substrate main surface 43 present between the photoelectric surface 50 and the extraction electrode 60. Using the gap G1, it is possible to bond the extraction electrode 60 to the glass substrate 40 with a sufficient amount of the bonding member 45y. The exposed region 43s is used for an adhesive pool for the bonding member 45y. Accordingly, fixing strength of the extraction electrode 60 to the glass substrate 40 is increased.

<Base>

FIG. 1 will be referred to. The base 20 has a base main surface 20a and a base back surface 20b. The base 20 has a base hole 20H. The base hole 20H penetrates from the base main surface 20a to the base back surface 20b. The base hole 20H guides the laser light 101 radiated from the base back surface 20b side to the base main surface 20a side. The photoelectric-surface electron source unit 10 is disposed on the base main surface 20a side. The light guided to the base main surface 20a side is incident on the photoelectric-surface electron source unit 10.

A unit arranging part 21, fixing member arranging parts 22, and fastener exposing parts 23 are provided on the base main surface 20a. The photoelectric-surface electron source unit 10 is disposed in the unit arranging part 21. The unit arranging part 21 is a recessed part. A shape of the unit arranging part 21 is slightly larger than the glass substrate 40. The unit arranging part 21 includes the base hole 20H. The fixing member arranging parts 22 are recessed grooves. The fixing member arranging parts 22 extend from corner parts of the unit arranging part 21 to an outer circumferential edge. The fastener exposing parts 23 are recessed grooves. The fastener exposing parts 23 extend from side parts of the unit arranging part 21 to the outer circumferential edge.

<Surrounding Electrode>

The surrounding electrode 30 is disposed on the base main surface 20a. A surrounding electrode main surface 30a of the surrounding electrode 30 is flush with the electrode main surface 62a of the extraction electrode 60. The extraction electrode 60 does not substantially protrude from the surrounding electrode 30 in a cross-section in the normal direction N of the extraction electrode 60 and the surrounding electrode 30. In addition, the surrounding electrode 30 also does not substantially protrude from the extraction electrode 60 in the cross-section in the normal direction N of the extraction electrode 60 and the surrounding electrode 30. The surrounding electrode 30 includes an extraction electrode arranging part 31, fixing member exposing parts 32, and fastener exposing parts 33. The extraction electrode arranging part 31 exposes the extraction electrode 60. The fixing member exposing parts 32 expose the fixing members 42. The fastener exposing parts 33 expose the conductive fasteners 49A and 49B. The surrounding electrode 30 covers most regions of the base main surface 20a except for the extraction electrode 60, the fixing members 42, and the conductive fasteners 49A and 49B.

The surrounding electrode 30 is made of a conductive material such as a metal. Also, the surrounding electrode 30 itself is not limited to a conductive material. The surrounding electrode 30 may be an insulating material coated with a conductive material. The surrounding electrode 30 may be a semiconductor material coated with a conductive material. A potential of the surrounding electrode 30 is the same as a potential of the extraction electrode 60. According to the extraction electrode 60 and the surrounding electrode 30 as described above, a good electric field with little disturbance can be formed on the extraction electrode 60 and the surrounding electrode 30.

Figure 6:
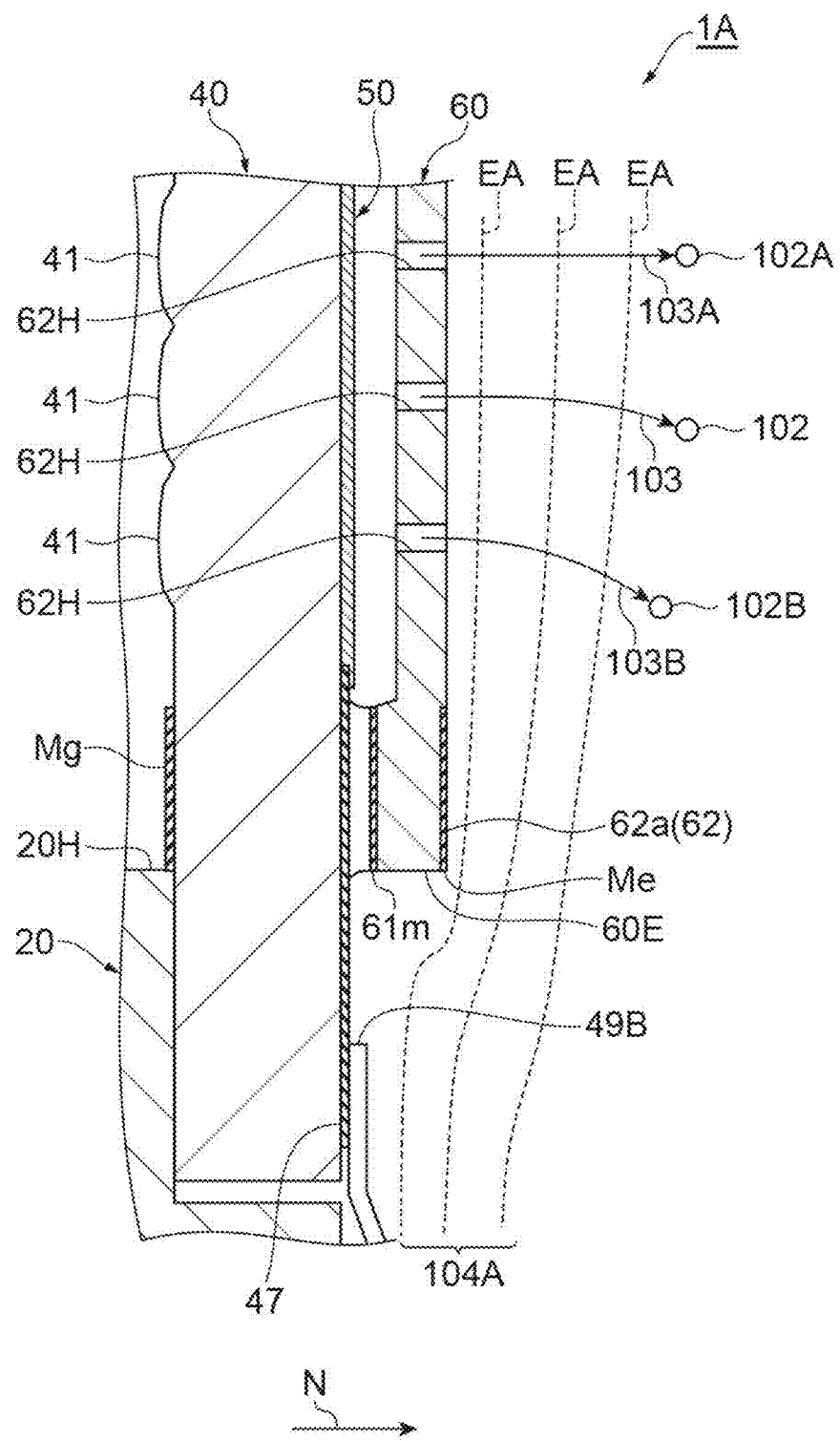
FIG. 6 is an enlarged cross-sectional view showing a part of a photoelectric-surface electron source according to a modified example including no surrounding electrode.

For example, in a case in which the surrounding electrode 30 is not provided like a photoelectric-surface electron source 1A shown in FIG. 6, an electric field 104A represented by equipotential surfaces EA is generated near an electrode edge part 60E. The equipotential surfaces EA include parts inclined relative to the electrode main surface 62a. The electric field 104A is called a diverging lens. The electric field 104A is sometimes called an electron lens. Electrons perform an accelerated motion perpendicular to the equipotential surfaces EA. Accordingly, the electron trajectory of the photoelectrons 102 extracted from the photoelectric surface 50 by the extraction electrode 60 coincides with the normal direction N when the equipotential surfaces EA are parallel to the electrode main surface 62a. For example, in a region separated from the electrode edge part 60E, influence of disturbance of the electric field is small. In the electric field in the region separated from the electrode edge part 60E, the equipotential surfaces EA are parallel to the electrode main surface 62a. Accordingly, an electron trajectory of a photoelectron 102A coincides with the normal direction N. In other words, the electron trajectory of the photoelectron 102A coincides with an electron trajectory 103A. However, in a region in which the equipotential surfaces EA are influenced by the disturbance of the electric field due to being close to the electrode edge part 60E and inclined relative to the electrode main surface 62a, the electron trajectory (electron trajectory 103B) deviates from the normal direction N due to the diverging lens generated near the electrode edge part 60E like a photoelectron 102B.

Figure 7:
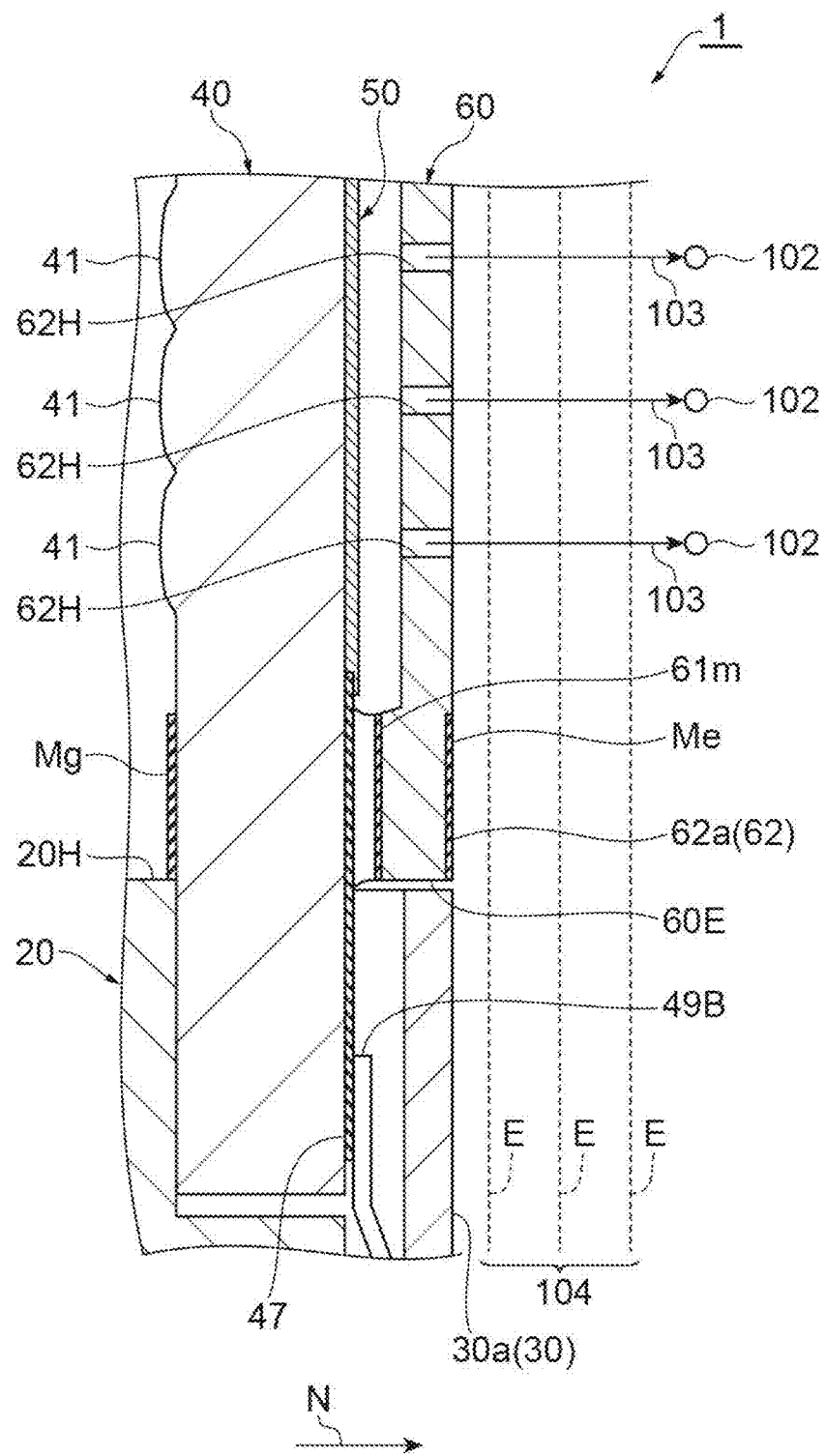
FIG. 7 is an enlarged cross-sectional view showing a part of a photoelectric-surface electron source of an embodiment including a surrounding electrode.

In a case in which the surrounding electrode 30 is provided like the photoelectric-surface electron source 1 shown in FIG. 7, an electric field 104 including equipotential surfaces E parallel to the electrode main surface 62a is also formed near the electrode edge part 60E. The surrounding electrode main surface 30a and the electrode main surface 62a are flush with each other. Further, there is no gap or step between the surrounding electrode main surface 30a and the electrode main surface 62a that would affect formation of an electric field. Therefore, the potential of the surrounding electrode 30 and the potential of the extraction electrode 60 are equal. As a result, the electric field 104 is formed.

According to the surrounding electrode 30, a good electric field 104 can be formed. On the other hand, it is also conceivable to provide a similar configuration by enlarging the extraction electrode 60. However, a problem such as warping of the extraction electrode 60 may occur.

In the above description, meanings of "the surrounding electrode main surface 30a and the electrode main surface 62a are flush with each other," "there is no gap or step between the surrounding electrode main surface 30a and the electrode main surface 62a that would affect formation of an electric field," and "the potential of the surrounding electrode 30 and the potential of the extraction electrode 60 are equal" include any configuration that can realize the desired electron trajectory 103 of the photoelectrons 102. That is, even if there is a gap and a step between the surrounding electrode main surface 30a and the electrode main surface 62a when viewed microscopically, it may be said that there is no gap or step between the surrounding electrode main surface 30a and the electrode main surface 62a in a case in which it can be said that the electron trajectory 103 of the photoelectrons 102 is generally in the normal direction N and the desired electron trajectory 103 is obtained. The same applies to a relationship between the potential of the surrounding electrode 30 and the potential of the extraction electrode 60.

Effects

The photoelectric-surface electron source 1 includes the glass substrate 40 that receives the laser light 101 incident from the substrate light-receiving surface 50a and emits the laser light 101 from the substrate main surface 43 on the side opposite to the substrate light-receiving surface 50a, the photoelectric surface 50 that is provided on the substrate main surface 43 and receives the laser light 101 to emit photoelectrons 102, and the extraction electrode 60 that is fixed to the substrate main surface 43 and extracts the photoelectrons 102 emitted from the photoelectric surface 50. The extraction electrode 60 is disposed to be separated from the photoelectric surface 50 on the substrate main surface 43 side. The extraction electrode 60 has the electrode part 62 provided with the electrode holes 62H for passing the photoelectrons 102 therethrough, and the frame part 61 fixed to the region surrounding the photoelectric surface 50 on the substrate main surface 43.

In the extraction electrode 60, the electrode part 62 provided with the electrode holes 62H through which the photoelectrons 102 pass is fixed to the glass substrate 40 by the frame part 61. As a result, it is possible to stably fix the electrode part 62 to the glass substrate 40. That is, it is possible to fix the electrode part 62 to the glass substrate 40 such that the distance from the photoelectric surface 50 to the electrode part 62 becomes a predetermined distance. Further, the electrode part 62 is fixed to the glass substrate 40. Accordingly, it is also possible to set positions of the electrode holes 62H of the electrode part 62 relative to the microlenses 41 at predetermined positions. As a result, influence of a positional relationship between the glass substrate 40 provided with the microlenses 41 and the photoelectric surface 50 and the extraction electrode 60 on the electron beams can be reduced. Accordingly, it is possible to obtain the electron beams having desired characteristics.

In the photoelectric-surface electron source 1, the microlenses 41 for focusing the laser light 101 toward the photoelectric surface 50 are disposed on the substrate light-receiving surface 50a side. According to this configuration, it is possible to obtain the electron beams based on the focused light.

In the photoelectric-surface electron source 1, the frame part 61 and the electrode part 62 are integral members. According to this configuration, it is possible to fix the electrode part 62 to the glass substrate 40 in a more stable state. The plurality of electrode holes 62H are formed in the electrode part 62. Since the frame part 61 is integrated thereto, warping of the electrode part 62 can be inhibited.

The photoelectric-surface electron source 1 further includes the surrounding electrode 30 surrounding the extraction electrode 60 to expose the electrode part 62 of the extraction electrode 60. According to this configuration, the electric field 104 around the extraction electrode 60 can be controlled. Accordingly, it is possible to control the electron trajectory 103 of the photoelectrons 102 affected by the electric field 104.

The surrounding electrode main surface 30a of the surrounding electrode 30 is flush with the electrode main surface 62a, which is the surface of the electrode part 62 from which the photoelectrons 102 are emitted. According to this configuration, the electric field 104 around the extraction electrode 60 can be stabilized. Accordingly, it is possible to stabilize the electron trajectory 103 of the emitted photoelectrons 102.

The potential of the surrounding electrode 30 is the same as the potential of the extraction electrode 60. According to this setting, the electric field 104 around the extraction electrode 60 can be stabilized. Accordingly, it is possible to stabilize the electron trajectory 103 of the photoelectrons 102 affected by the electric field 104.

The surrounding electrode 30 is made of a metal material. According to this configuration, it is possible to easily manufacture the surrounding electrode 30 that can be set with high accuracy to have a predetermined potential.

The extraction electrode 60 includes the electrode part 62 made of silicon, which is a semiconductor material, and the metal film 64 covering the surface of the electrode part 62. According to this configuration, it is possible to easily manufacture the extraction electrode 60 that has the electrode holes 62H penetrating therethrough and can be set to a predetermined potential.

The glass substrate 40 further has the electrode bonding part 45 that is provided on the substrate main surface 43 and mechanically and electrically connects the frame part 61 of the extraction electrode 60, and the extraction power supply part 46 that applies a voltage to the extraction electrode 60 via the electrode bonding part 45. According to this configuration, the extraction electrode 60 can be reliably fixed to the glass substrate 40. Further, power supply to the extraction electrode 60 can be reliably performed.

The frame part 61 has the frame bonding part 61a fixed to the substrate main surface 43. The inner wall surface 61s of the frame part 61 is inclined to widen from the electrode part 62 side toward the frame bonding part 61a. According to this configuration, the photoelectric surface 50 can be kept away from the frame bonding part 61a. Accordingly, withstand voltage performance between the frame bonding part 61a and the photoelectric surface 50 can be improved.

MODIFIED EXAMPLES

The photoelectric-surface electron source of the present invention is not limited to the above aspects.

The microlenses 41 only need to be able to condense the laser light 101 received from the substrate back surface 44 on the substrate main surface 43 side. Specific configurations of the microlenses 41 are not limited. For example, the microlenses 41 may be so-called convex lenses that collect light using a difference in refractive index. The microlenses 41 may be metalenses formed by a fine uneven structure. The microlenses 41 are not limited to lenses integrally formed with the glass substrate 40 on which the photoelectric surface 50 is formed. The microlenses 41 may be provided separately from the glass substrate 40 on which the photoelectric surface 50 is formed. The microlenses 41 may be brought into contact with the glass substrate 40. The microlenses 41 may be separated from the glass substrate 40.

The metal film layer 45x and the bonding member 45y are not limited to the case in which they are formed integrally in a frame shape. The metal film layer 45x and the bonding member 45y may be divided into a plurality of parts. The metal film layer 61m may be divided into a plurality of pieces like the metal film layer 45x. Thus, regions affected by thermal expansion of the metal film layer 45x, the bonding member 45y, and the metal film layer 61m are divided into small regions. As a result, a stress due to thermal expansion applied to the entire glass substrate 40 and extraction electrode 60 is dispersed. Accordingly, the warping can be inhibited without providing the metal film layer Mg and the metal film layer Me.

The frame part 61 and the electrode part 62 may be assembled after they have been prepared as separate members. In this case, the frame part 61 has an electrode bonding surface in addition to the frame bonding part 61a.

REFERENCE SIGNS LIST 1,1: A Photoelectric-surface electron source, 10: Photoelectric-surface electron source unit, 20: Base, 20H: Base hole, 21: Unit arranging part, 22: Fixing member arranging part, 23: Fastener exposing part, 30: Surrounding electrode, 31: Extraction electrode arranging part, 32: Fixing member exposing part, 40: Glass substrate, 41: Microlens, 42: Fixing member, 45: Electrode bonding part, 45G: Opening part, 46: Extraction power supply part, 47: Photoelectric-surface power supply part, 49A, 49B: Conductive fastener, 50: Photoelectric surface, 60: Extraction electrode, 61: Frame part, 61G: Opening part, 61a: Frame bonding part, 62: Electrode part, 62H: Electrode hole, 64: Metal film (conductive film), 101: Laser light, 102: Photoelectron, 103: Electron trajectory, 104: Electric field, E: Equipotential surface, N: Normal direction.

The invention claimed is:

1. A photoelectric-surface electron source comprising:
a substrate configured to receive light incident from a substrate light-receiving surface and emit the light from a substrate main surface on a side opposite to the substrate light-receiving surface;
a photoelectric surface provided on the substrate main surface to receive the light to emit photoelectrons; and
an extraction electrode fixed to the substrate main surface to extract the photoelectrons from the photoelectric surface,
wherein the extraction electrode includes:
an electrode part that is disposed to be separated from the photoelectric surface on the substrate main surface side and provided with holes through which the photoelectrons pass,
a frame part fixed to a region surrounding the photoelectric surface on the substrate main surface, and
an electrode body made of a semiconductor material and a conductive film covering a surface of the electrode body.

2. The photoelectric-surface electron source according to claim 1, wherein a lens part configured to focus the light toward the photoelectric surface is disposed on the substrate light-receiving surface side.

3. The photoelectric-surface electron source according to claim 1, wherein the electrode part and the frame part are an integral member.

4. The photoelectric-surface electron source according to claim 1, further comprising a surrounding electrode configured to surround the extraction electrode to expose the electrode part of the extraction electrode.

5. The photoelectric-surface electron source according to claim 4, wherein a main surface of the surrounding electrode is flush with an electrode main surface that is a surface of the electrode part on a side from which the electrons are emitted.

6. The photoelectric-surface electron source according to claim 4, wherein the surrounding electrode has the same potential as the extraction electrode.

7. The photoelectric-surface electron source according to claim 4, wherein the surrounding electrode is made of a metal material.

8. The photoelectric-surface electron source according to claim 1,
wherein the substrate further includes:
an electrode bonding part provided on the substrate main surface to mechanically and electrically connect the frame part of the extraction electrode, and
a voltage applying part configured to apply a voltage to the extraction electrode via the electrode bonding part.

9. The photoelectric-surface electron source according to claim 1, wherein the electrode part and the frame part are electrically connected to each other.

10. A photoelectric-surface electron source comprising:
a substrate configured to receive light incident from a substrate light-receiving surface and emit the light from a substrate main surface on a side opposite to the substrate light-receiving surface;
a photoelectric surface provided on the substrate main surface to receive the light to emit photoelectrons; and
an extraction electrode fixed to the substrate main surface to extract the photoelectrons from the photoelectric surface, wherein the extraction electrode includes:
an electrode part that is disposed to be separated from the photoelectric surface on the substrate main surface side and provided with holes through which the photoelectrons pass, and
a frame part fixed to a region surrounding the photoelectric surface on the substrate main surface,
wherein the frame part includes a frame bonding part fixed to the substrate main surface, and
an inner wall surface of the frame part is inclined to widen from the electrode part side toward the frame bonding part.

11. The photoelectric-surface electron source according to claim 10, wherein a lens part configured to focus the light toward the photoelectric surface is disposed on the substrate light-receiving surface side.

12. The photoelectric-surface electron source according to claim 10, wherein the electrode part and the frame part are an integral member.

13. The photoelectric-surface electron source according to claim 10, further comprising a surrounding electrode configured to surround the extraction electrode to expose the electrode part of the extraction electrode.

14. The photoelectric-surface electron source according to claim 13, wherein a main surface of the surrounding electrode is flush with an electrode main surface that is a surface of the electrode part on a side from which the electrons are emitted.

15. The photoelectric-surface electron source according to claim 13, wherein the surrounding electrode has the same potential as the extraction electrode.

16. The photoelectric-surface electron source according to claim 13, wherein the surrounding electrode is made of a metal material.

17. The photoelectric-surface electron source according to claim 10,
wherein the substrate further includes:
an electrode bonding part provided on the substrate main surface to mechanically and electrically connect the frame part of the extraction electrode, and
a voltage applying part configured to apply a voltage to the extraction electrode via the electrode bonding part.

18. The photoelectric-surface electron source according to claim 10, wherein the electrode part and the frame part are electrically connected to each other.

* * * * *